(12) United States Patent
Shin et al.

(10) Patent No.: US 12,341,118 B2
(45) Date of Patent: Jun. 24, 2025

(54) SEMICONDUCTOR PACKAGE INCLUDING AN ENCAPSULANT

(71) Applicant: SAMSUNG ELECTRONICS CO., LTD., Suwon-si (KR)

(72) Inventors: Seungwan Shin, Hwaseong-si (KR); Junghoon Kang, Anyang-si (KR); Gun Lee, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 415 days.

(21) Appl. No.: 17/741,581

(22) Filed: May 11, 2022

(65) Prior Publication Data

US 2023/0083493 A1 Mar. 16, 2023

(30) Foreign Application Priority Data

Sep. 10, 2021 (KR) .................. 10-2021-0120816

(51) Int. Cl.
  *H01L 23/00* (2006.01)
  *H01L 23/29* (2006.01)
  (Continued)

(52) U.S. Cl.
  CPC ............ *H01L 24/25* (2013.01); *H01L 23/295* (2013.01); *H01L 23/3171* (2013.01); *H01L 23/3185* (2013.01); *H01L 23/5329* (2013.01); *H01L 24/13* (2013.01); *H01L 24/49* (2013.01); *H01L 25/0657* (2013.01); *H01L 2224/13023* (2013.01);
  (Continued)

(58) Field of Classification Search
  CPC .. H01L 24/25; H01L 23/3171; H01L 23/3185; H01L 23/5329; H01L 24/49
  See application file for complete search history.

(56) References Cited

U.S. PATENT DOCUMENTS 9,806,040 B2 10/2017 Liu et al.
10,453,785 B2 10/2019 Shim et al.
(Continued)

FOREIGN PATENT DOCUMENTS

KR 10-2020-0133501 11/2020

*Primary Examiner* — Shih Tsun A Chou
(74) *Attorney, Agent, or Firm* — MORGAN, LEWIS & BOCKIUS LLP

(57) ABSTRACT

A semiconductor package includes: a lower redistribution structure including a lower insulating layer and a lower redistribution layer; a semiconductor chip disposed on the lower redistribution structure; connection conductors connected to the lower redistribution layer; an encapsulant disposed on the connection conductors; and an upper redistribution structure including an upper insulating layer and upper redistribution layers, wherein the upper insulating layer is disposed on the encapsulant, wherein the upper redistribution layers are disposed on the upper insulating layer, wherein the connection conductors and the encapsulant form a first step, wherein the upper redistribution layers include first and second upper redistribution layers, wherein the first upper redistribution layer does not overlap the connection conductors, wherein the second upper redistribution layer overlaps the connection conductors, wherein the first and second upper redistribution layers form a second step with a height substantially equal to or smaller than that of the first step.

20 Claims, 12 Drawing Sheets

(51) Int. Cl.
*H01L 23/31* (2006.01)
*H01L 23/532* (2006.01)
*H01L 25/065* (2023.01)

(52) U.S. Cl.
CPC ................ *H01L 2224/2541* (2013.01); *H01L 2224/49105* (2013.01)

(56) References Cited

U.S. PATENT DOCUMENTS

2016/0374206 A1* 12/2016 Lan .................. H05K 3/426
2017/0092617 A1 3/2017 Wu et al.
2020/0161203 A1 5/2020 Kim et al.
2020/0203283 A1* 6/2020 Lee .................. H01L 23/49827
2021/0118792 A1 4/2021 Lee et al.

* cited by examiner

SEMICONDUCTOR PACKAGE INCLUDING AN ENCAPSULANT

CROSS-REFERENCE TO RELATED APPLICATION

This application claims the priority under 35 USC 119(a) to Korean Patent Application No. 10-2021-0120816, filed on Sep. 10, 2021, in the Korean Intellectual Property Office, the disclosure of which is incorporated by reference herein in its entirety.

TECHNICAL FIELD

The present inventive concept relates to a semiconductor package, and more particularly, to a semiconductor package including an encapsulant.

DISCUSSION OF THE RELATED ART

In accordance with the trend for high performance and high miniaturization of electronic devices, a package-on-package (POP) technology has been under development. Package-on package technology typically includes semiconductor packages, which include different semiconductor chips, vertically stacked on each other. To implement a package-on-package of a semiconductor package including a high-performance semiconductor chip, it may be desirable to form an upper redistribution layer of the semiconductor package to have a fine pitch.

SUMMARY

According to an example embodiment of the present inventive concept, a semiconductor package includes: a lower redistribution structure including a lower insulating layer and a lower redistribution layer disposed on the lower insulating layer, a semiconductor chip disposed on the lower redistribution structure, and including a connection pad electrically connected to the lower redistribution layer, connection conductors disposed around the semiconductor chip on the lower redistribution structure, and electrically connected to the lower redistribution layer; an encapsulant disposed on at least a portion of the semiconductor chip and the connection conductors; and an upper redistribution structure including an upper insulating layer and upper redistribution layers, wherein the upper insulating layer is disposed on the encapsulant, wherein the upper redistribution layers are disposed on the upper insulating layer and are electrically connected to the connection conductors, wherein an upper surface of each of the connection conductors and an upper surface of the encapsulant form a first step in a first direction, substantially perpendicular to an upper surface of the lower redistribution structure, wherein the upper redistribution layers include a first upper redistribution layer and a second upper redistribution layer, wherein the first upper redistribution layer does not overlap the connection conductors, wherein the second upper redistribution layer overlaps the connection conductors, in the first direction, wherein a lower surface of the first upper redistribution layer and a lower surface of the second upper redistribution layer form a second step, and wherein a height of the second step is substantially equal to or smaller than a height of the first step in the first direction.

According to an example embodiment of the present inventive concept, a semiconductor package includes: a lower redistribution structure including a lower redistribution layer, a semiconductor chip disposed on the lower redistribution structure, and including a connection pad electrically connected to the lower redistribution layer; connection conductors disposed adjacent to the semiconductor chip on the lower redistribution structure, and electrically connected to the lower redistribution layer; an encapsulant covering at least a portion of the semiconductor chip and the connection conductors; and an upper redistribution structure including an upper insulating layer and upper redistribution layers, wherein the upper insulating layer is disposed on an upper surface of the encapsulant and upper surfaces of the connection conductors, wherein the upper redistribution layers are disposed on the upper insulating layer and electrically connected to the connection conductors, wherein the upper surface of the encapsulant is disposed on a level lower than that of the upper surfaces of the connection conductors, and wherein a first portion of the upper redistribution layers disposed on the upper surface of the encapsulant are disposed on a level lower than that of a second portion of the upper redistribution layers disposed on an upper surface of a corresponding connection conductor of the connection conductors.

According to an example embodiment of the present inventive concept, a semiconductor package includes: a lower redistribution structure including a lower redistribution layer; a semiconductor chip disposed on the lower redistribution structure, and including a connection pad electrically connected to the lower redistribution layer; connection conductors disposed around the semiconductor chip on the lower redistribution structure, and electrically connected to the lower redistribution layer; an encapsulant disposed on at least portions of side surfaces of the connection conductors, and having an upper surface including a plurality of grooves; and an upper redistribution structure including an upper insulating layer and an upper redistribution layer, wherein the upper insulating layer is disposed on the encapsulant and the connection conductors, and the upper redistribution layer is disposed on the upper insulating layer and electrically connected to the connection conductors, and wherein there is a height difference between the upper surface of the encapsulant and an upper surface of a first connection conductor of the connection conductors.

BRIEF DESCRIPTION OF DRAWINGS

The above and other features of the present inventive concept will become more apparent by describing in detail example embodiments thereof, with reference to the accompanying drawings, in which.

DETAILED DESCRIPTION OF THE EMBODIMENTS

Hereinafter, example embodiments of the present inventive concept will be described with reference to the accompanying drawings.

Figure 1A:
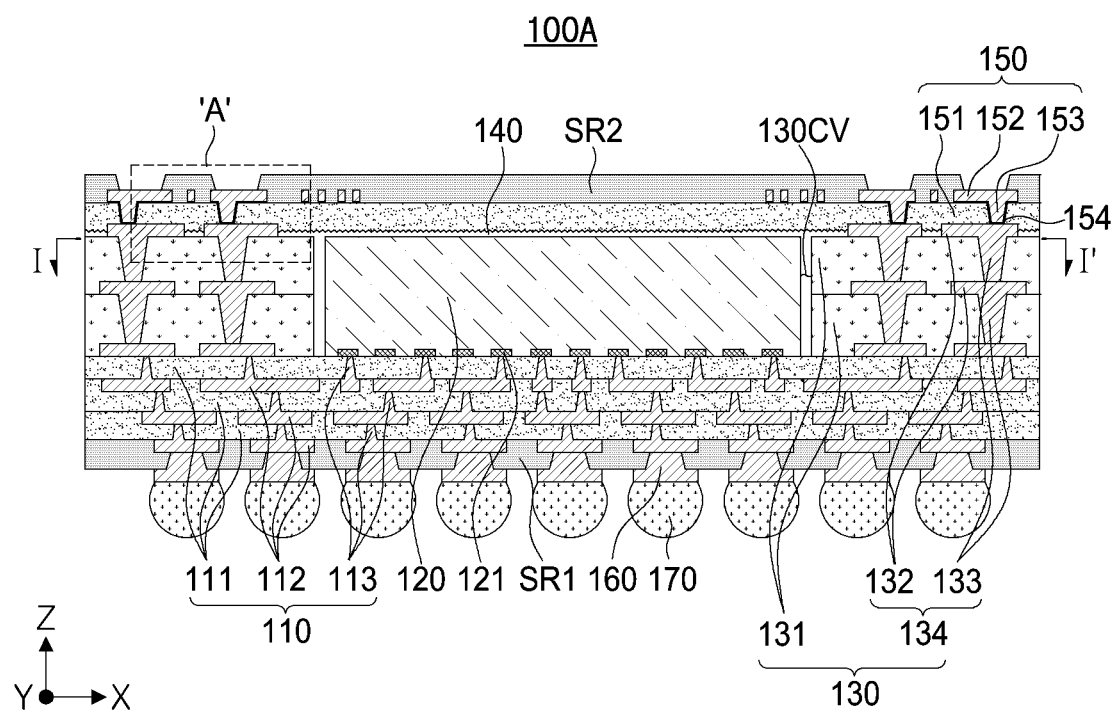
FIG. 1A is a cross-sectional view illustrating a semiconductor package according to an example embodiment of the present inventive concept.
Figure 1B:
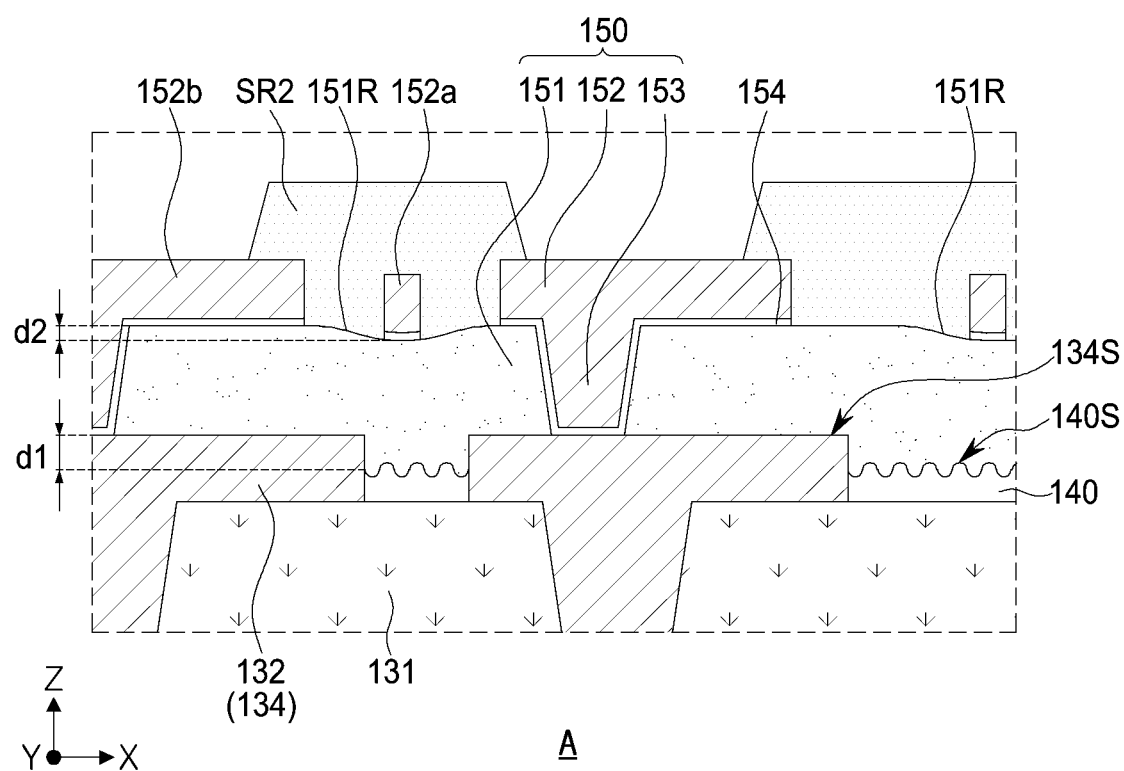
FIG. 1B is a partially enlarged view illustrating region 'A' of FIG. 1A.

FIG. 1A is a cross-sectional view illustrating a semiconductor package according to an example embodiment of the present inventive concept. FIG. 1B is a partially enlarged view illustrating region 'A' of FIG. 1A, and FIG. 1C is a plan view illustrating a cross-section taken along line I-I' of FIG. 1A.

Figure 1C:
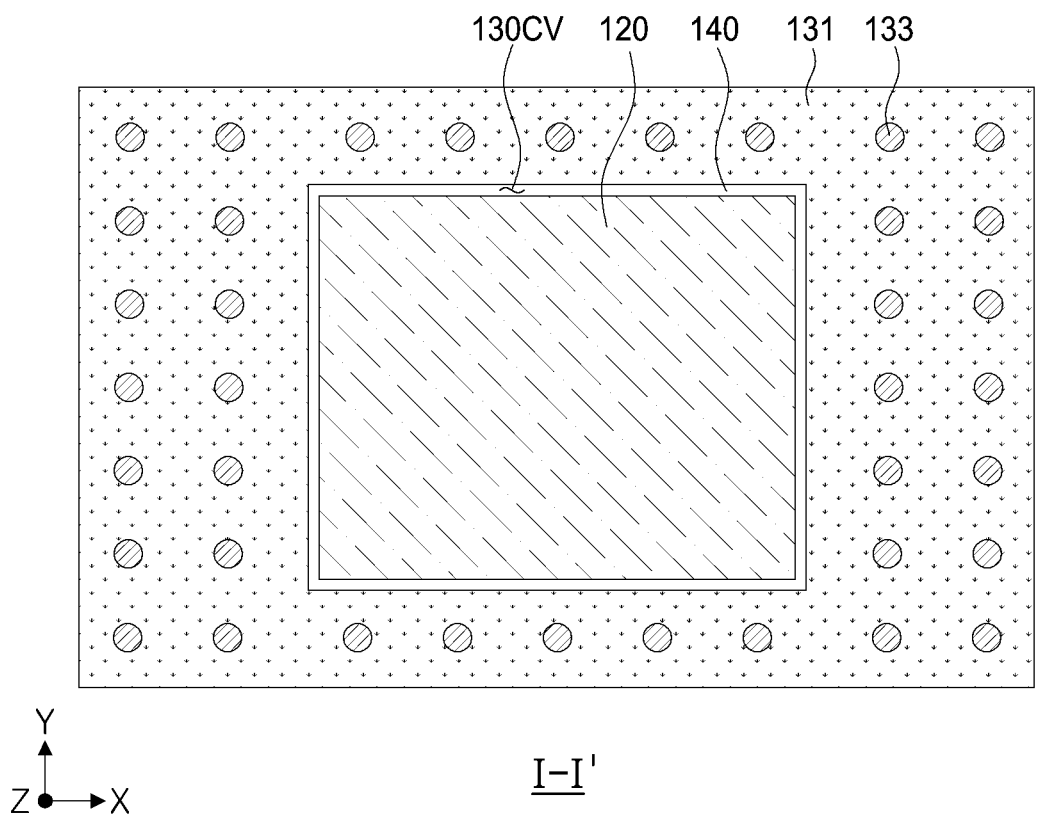
FIG. 1C is a plan view illustrating a cross-section taken along line I-I' of FIG. 1A.

Referring to FIGS. 1A to 1C, a semiconductor package 100A according to an example embodiment of the present inventive concept may include a lower redistribution structure 110, a semiconductor chip 120, a connection structure 130, an encapsulant 140, and an upper redistribution structure 150. In the present inventive concept, by processing the encapsulant 140 using a laser, a step is formed between an upper surface of the encapsulant 140 and the connection structure 130 (or, e.g., an upper surface of a connection conductor 134), and at substantially the same time, surface roughness (Ra) is formed in the upper surface of the encapsulant 140. As a result, according to an example embodiment of the present inventive concept, adhesion of the upper insulating layer 151 may be increased and undulation of the upper insulating layer 151 may be minimized, so that the upper redistribution layer 152 and the upper redistribution via 153 may be formed to have a fine pitch. In addition, since a portion of the encapsulant 140 remains on at least a portion of the upper surface of the connection structure 130, damage to the connection structure 130 may be prevented during a processing process of the encapsulant 140.

The lower redistribution structure 110 is a support substrate on which the semiconductor chip 120 is mounted, and may include a lower insulating layer 111 and lower redistribution conductors 112 and 113 redistributing a connection pad 121 of the semiconductor chip 120. The lower redistribution conductors 112 and 113 may include a lower redistribution layer 112 and a lower redistribution via 113. The lower redistribution layer 112 is disposed on the lower insulating layer 111, and the lower redistribution via 113 penetrates through the lower insulating layer 111. The lower redistribution structure 110 may include a bigger or smaller number of lower insulating layers 111, lower redistribution layers 112, and lower redistribution vias 113 than what is illustrated in the drawings.

The lower insulating layer 111 may include an insulating resin. For example, the insulating resin may include a thermosetting resin such as an epoxy resin, a thermoplastic resin such as a polyimide, or a resin impregnated with inorganic fillers or/and glass fibers (Glass Fiber, Glass Cloth, Glass Fabric) in these resins, for example, prepreg, Ajinomoto Build-up Film (ABF), FR-4, Bismaleimide Triazine (BT). For example, the lower insulating layer 111 may include a photosensitive resin such as a Photoimageable Dielectric (PID). The lower insulating layer 111 may include a plurality of lower insulating layers 111 stacked in a vertical direction (e.g., Z-axis direction). For example, depending on the process, a boundary between the lower insulating layers 111 of different levels may be unclear or not clearly visible. In addition, for convenience of explanation, only three lower insulating layers 111 are illustrated in the drawings, but example embodiments of the present inventive concept are not limited thereto. According to an example embodiment of the present inventive concept, the lower redistribution structure 110 may also include four or more lower insulating layers 111.

The lower redistribution layer 112 may include, for example, copper (Cu), aluminum (Al), silver (Ag), tin (Sn), gold (Au), nickel (Ni), lead (Pb), titanium (Ti), or a metal material including alloys thereof. The lower redistribution layer 112 may include a ground (GND) pattern, a power (PWR) pattern, and a signal (S) pattern. The signal (S) pattern may provide a path through which various signals except for the ground (GND) pattern and the power (PWR) pattern, are transmitted/received. For example, a data signal or the like may be transmitted/received through the path. The lower redistribution layer 112 may include a plurality of lower redistribution layers respectively disposed below the plurality of lower insulating layers 111. For example, the plurality of lower redistribution layers 112 and the plurality of lower insulating layers 111 may be alternately stacked on each other. The plurality of lower redistribution layers 112 may be electrically connected to each other through a lower redistribution via 113. For example, a lowermost redistribution layer 112, in contact with a connection bump 170, may be formed to have a greater thickness than the redistribution layers disposed there above. The number of layers of the lower redistribution layers 112 may be determined according to the number of layers of the lower insulating layers 111, and may include more or fewer layers than shown in the drawings.

The lower redistribution via 113 may be electrically connected to the lower redistribution layer 112, and may include a signal via, a ground via, and a power via. The lower redistribution via 113 may include, for example, copper (Cu), aluminum (Al), silver (Ag), tin (Sn), gold (Au), nickel (Ni), lead (Pb), titanium (Ti), or a metal material including alloys thereof. The lower redistribution via 113 may have a form of a via filled with a metal material. For example, the lower redistribution via 113 may be a via hole filled with a metal material or a conformal via in which a metal material is formed along an inner wall of the via hole of the conformal via. The lower redistribution via 113 may be integrated with the lower redistribution layer 112, but the present inventive concept is not limited thereto.

The semiconductor chip 120 may be disposed on the lower redistribution structure 110, and may include a connection pad 121 electrically connected to the lower redistribution layer 112. The semiconductor chip 120 may be an integrated circuit (IC) in a bare state in which a separate bump or a wiring layer is not formed, but an example embodiment thereof is not limited thereto, and for example, the semiconductor chip 120 may be a packaged-type integrated circuit. Accordingly, the connection pad 121 may be understood as a pad of a bare chip (e.g., an aluminum (Al) pad) or a bump formed on the pad. The integrated circuit may be formed based on an active wafer. The semiconductor chip 120 may include, for example, silicon (Si), germanium (Ge), or gallium arsenide (GaAs), and various types of integrated circuits may be formed therein. The integrated circuit may be a processor chip such as a central processor (e.g., CPU), a graphics processor (e.g., GPU), a field programmable gate array (FPGA), an application processor (AP), a digital signal processor, a cryptographic processor, a microprocessor, and the like, but the present inventive concept is not limited thereto, and for example, the integrated circuit may be a memory chip such as a logic chip such as a central processor (CPU), a graphics processor (GPU), a field programmable gate array (FPGA), a digital signal processor, an encryption processor, a microprocessor, a microcontroller, an analog-digital converter, an application-specific IC (ASIC), or a memory chip such as a volatile memory (e.g., DRAM), a non-volatile memory (e.g., ROM and a flash memory). The connection pad 121 may electrically connect the integrated circuit of the semiconductor chip 120 with other components.

The connection structure 130 may be disposed on the lower redistribution structure 110 and may provide an electrical path between the lower redistribution layer 112 and the upper redistribution layer 152 around the semiconductor chip 120 by connecting the lower redistribution layer 112 and the upper redistribution layer 152 to each other. The connection structure 130 may include an insulating layer 131 and a connection conductor 134. The connection conductor 134 extends in a vertical direction (e.g., Z-axis direction) and penetrates the insulating layer 131 to electrically connect the lower redistribution layer 112 and the upper redistribution layer 152 to each other. The connection conductor 134 may include a wiring layer 132 and a wiring via 133. The wiring layer 132 may be disposed on upper and lower surfaces of the insulating layer 131, and the wiring via 133 may penetrate through the insulating layer 131.

The connection structure 130 may increase rigidity of the semiconductor package 100A according to a material of the insulating layer 131, and may secure thickness uniformity of the encapsulant 140. The connection structure 130 may have a cavity 130CV in which the semiconductor chip 120 is disposed.

The insulating layer 131 may be, for example, an insulating resin. For example, the insulating resin may include a thermosetting resin such as an epoxy resin, a thermoplastic resin such as polyimide, or a resin impregnated with inorganic fillers, for example, ABF, or the like may be used. In addition, a material, in which the resins described above are impregnated with glass fibers, together with the inorganic fillers, for example, prepreg or the like, may be used. According to an example embodiment of the present inventive concept, the connection structure 130 may include only the connection conductor 134 in a form of a post without for the insulating layer 131.

The wiring layer 132 may provide an upper/lower electrical connection path of the package together with the wiring via 133, and may serve to redistribute the connection pad 121. The wiring layer 132 may include, for example, copper (Cu), aluminum (Al), silver (Ag), tin (Sn), gold (Au), nickel (Ni), lead (Pb), titanium (Ti), or a metal material of an alloy thereof. The wiring layer 132, for example, may include a ground pattern, a power pattern, a signal pattern, etc. according to the design of the corresponding layer. In addition, the wiring layer 132 may be formed by a plating process such as SAP, MSAP, or the like, and may be comprised of a seed layer and a conductor layer. For example, a thickness of each of the wiring layers 132 may be greater than a thickness of each of the lower redistribution layers 112. The connection structure 130 may have a thickness, greater than or equal to that of the semiconductor chip 120, and a material of the insulating layer 111 may be selected as prepreg to maintain rigidity, whereas the lower redistribution structure 110 may include a fine circuit and a high-density design. In addition, since a photosensitive resin (e.g., PID) is selected as the material of the insulating layer 111, the thickness of the wiring layer 132 may be relatively thick compared to the thickness of the lower redistribution layer 112.

The wiring via 133 electrically connects the wiring layers 132 formed in different layers to each other, and as a result, an electrical path may be formed in the connection structure 110. A material for forming the wiring via 133 may be, for example, copper (Cu), aluminum (Al), silver (Ag), tin (Sn), gold (Au), nickel (Ni), lead (Pb), titanium (Ti), a metal material including alloys thereof, or the like. The wiring via 133 may include a signal via, a power via, a ground via, and the like, and the power via and the ground via may be the same via. The wiring via 133 may have a filled-type via or a conformal-type via. The filled-type via may be filled with a metal material, and the conformal-type via may include a metal material that is formed along an inner surface of a via hole of the conformal-type via. For example, each of the wiring vias 133 may have a tapered shape. For example, the wiring via 133 may also be formed by a plating process, and may include a seed layer and a conductor layer. For example, the wiring via 133 may have a shape integrated with the wiring layer 132. However, the present inventive concept is not limited thereto. For example, the wiring via 133 may be a different material from that of the wiring layer 132.

According to an example embodiment of the present inventive concept, since the encapsulant 140 is formed to cover the upper surface of the connection structure 130, undulation of the upper redistribution structure 150 may be minimized. For example, the encapsulant 140 may cover at least a portion of an upper surface of the insulating layer 131 and at least a portion of a side surface each of the connection conductors 134 (or, e.g., of the wiring layer 132) protruding above the upper surface of the insulating layer 131. For example, the encapsulant 140 may expose at least a portion of an upper surface of the wiring layer 132. In this case, a thickness of the encapsulant 140 covering the upper surface of the connection structure 130 (or, e.g., the insulating layer 131) may be in a range about 1 μm or more, for example, about 1 μm to about 10 μm, about 2 μm to about 9 μm, about 3 μm to about 9 μm, about 4 μm to about 8 μm. When the thickness of the encapsulant 140 is less than about 1 μm, the connection structure 130 may be damaged during a processing process of the encapsulant 140 (refer to FIG. 2E).

The encapsulant 140 may encapsulate at least a portion of the semiconductor chip 120 and the connection structure 130 (or the connection conductors 134) on the lower redistribution structure 110. For example, the encapsulant may cover at least a portion of the semiconductor chip 120 and the connection structure 130. The encapsulant 140 may be formed of an insulating resin (e.g., ABF) in which an inorganic filler is included in an insulating resin such as an epoxy resin. According to example embodiment of the present inventive concept, an upper surface 140S of the encapsulant 140 may have a step from an upper surface 134S of the connection conductors 134, and may include a plurality of grooves. For example, the upper surface 140S of the encapsulant 140 may be uneven. The upper surface 140S of the encapsulant 140 may be disposed on a level lower than that of the upper surface 134S of the connection conductors 134. The plurality of grooves may provide surface roughness (Ra) on an upper surface 140S of the encapsulant 140, and may increase adhesion between the encapsulant 140 and the upper insulating layer 151. In one example, the upper surface 140S of the encapsulant 140 may have surface roughness in a range of about 1 μm or more, for example, about 1 μm to about 7 μm, about 2 μm to about 6 μm, or about 3 μm to about 5 μm.

The upper redistribution structure 150 may include an upper insulating layer 151, the upper redistribution layers 152, and the upper redistribution via 153. The insulating layer 151 may be disposed on the encapsulant 140 and the connection conductors 134. The upper redistribution layers 152 may be disposed on the upper insulating layer 151 and electrically connected to the connection conductors 134, and the upper redistribution via 153 may penetrate through the upper insulating layer 151 to connect the upper redistribution layers 152 to the connection conductors 134. Since the upper insulating layer 151, the upper redistribution layer 152, and the upper redistribution via 153 have the same or similar characteristics (e.g., configurations, arrangements and components) to the lower insulating layer 111, the lower redistribution layer 112, and the lower redistribution via 113 described above, overlapping descriptions thereof will be omitted. The upper redistribution layer 152 and the upper redistribution via 153 may include a seed layer 154 disposed between the upper insulating layer 151 and the upper redistribution layer 152 and between the upper insulating layer 151 and the upper redistribution via 53. For example, seed layer may be formed of a metal such as titanium (Ti) or copper (Cu), or an alloy thereof.

The upper insulating layer 151 may be disposed on an upper surface 140S of the encapsulant 140. For example, the upper insulating layer 151 may be in direct contact with an upper surface 140S of the encapsulant 140, and may include an insulating resin different from that of the encapsulant 140. The upper insulating layer 151 may include a material suitable for forming the upper redistribution layer 152 and the upper redistribution vias 153 to have a fine pitch, for example, a photosensitive resin such as PID. In addition, the encapsulant 140 may include a non-photosensitive resin (e.g., ABF) containing an inorganic filler to protect the semiconductor chip 120 and ensure durability of the semiconductor package 100A. Since the upper surface 140S of the encapsulant 140 has surface roughness (Ra) formed by laser processing, adhesion of the upper insulating layer 151 may be increased. An upper surface of the upper insulating layer 151 may have a recess portion 151R that is recessed corresponding to a step between an upper surface 134S of the connection conductors 134 and an upper surface 140S of the encapsulant 140. For example, the recess portion 151R may overlap the step formed between the upper surface 134S of the connection conductors 134 and the upper surface 140S of the encapsulant 140. For example, the recess portion 151R may be disposed between the connection conductors 134. As another example, the recess portion 151R may overlap the grooves formed in the upper surface 140S of the encapsulant 140. In an example embodiment of the present inventive concept, since an encapsulant 140 covering an upper surface of the connection structure 130 is disposed between the connection conductors 134, a depth of the recess portion 151R may be minimized. The depth of the recess portion 151R may affect a fine pitch of the upper redistribution layer 152 and the upper redistribution via 153, and according to the present inventive concept, a maximum depth of the recess portion 151R may be about 1 μm or less.

The upper redistribution layers 152 may be disposed on an upper surface of the upper insulating layer 151, and may be electrically connected to the connection conductor 134 through the upper redistribution via 153. For example, at least a portion (e.g., 152a) of the upper redistribution layers 152 disposed above the upper surface 140S of the encapsulant 140 may be disposed on a level lower than that of the other portion (e.g., 152b) of the upper redistribution layers 152 disposed above the upper surface 134S of the connection conductors 134. For example, the portion (e.g., 152a) of the upper redistribution layers 152, which may be disposed in the recess portion 151R of the upper insulating layer 151, may be disposed on a level lower than that of the other portion (e.g., 152b) of the upper redistribution layers 152 overlapping the upper surface 134S of the connection conductors 134. Here, a lower surface of at least a portion (e.g., 152a) of the upper redistribution layers 152 may have a step d2 of about 1 μm or less with a lower surface of the other portion (e.g., 152b) of the upper redistribution layers 152. For example, the lower surface of the portion (e.g., 152a) of the upper redistribution layers 152 be disposed lower than the lower surface of the other portion (e.g., 152b) of the upper redistribution layers 152 by about 1 μm. For example, the upper redistribution layers 152 may have a step according to the shapes of the structures thereunder, for example, the connection conductors 134 and the encapsulant 140, and according to the present inventive concept, since a step thickness difference between the upper redistribution layer 152 may be minimized, the upper redistribution layers 152 having a finer pitch may be implemented. For example, the connection conductors 134 may protrude further than the upper surface 140S of the encapsulant 140. For example, the upper surface 134S of each of the connection conductors 134 and the upper surface 140S of the encapsulant 140 may have a first step (d1) in a first direction (e.g., the Z-axis direction), substantially perpendicular to an upper surface of the lower redistribution structure 110. As another example, the upper redistribution layers 152 may include a first upper redistribution layer 152a and a second upper redistribution layer 152b. The first upper redistribution layer 152a does not overlap the connection conductors 134 in the first direction (e.g., the Z-axis direction), and the second upper redistribution layer 152b overlap the connection conductors 134. As an additional example, a lower surface of the first upper redistribution layer 152a and a lower surface of the second upper redistribution layer 152b may have a second step d2, substantially equal to or smaller than the first step d1. Here, a height of the first step d1 may be in a range of about 5 μm or less, for example, about 0.0001 μm to about 5 μm, about 0.0001 μm to about 4 μm, or about 0.0001 μm to about 3 μm. In addition, a height of the second step d2 may be in a range of about 1 μm or less, for example, about 0.001 μm to about 1 μm, or about 0.0001 μm to about 1 μm. The lower surface of the first upper redistribution layer 152a and the lower surface of the second upper redistribution layer 152b may be interpreted as a lower surface of the seed layer 154, respectively, and it can be interpreted that a maximum depth of the recess portion 151R is substantially equal to the height of the second step d2. In addition, in FIG. 1C, the first upper redistribution layer 152a and the second upper redistribution layer 152b are illustrated as a plurality of redistribution layers, spaced apart from each other, but this is for convenience of description, and the present inventive concept is not limited thereto and the first upper redistribution layer 152a and the second upper redistribution layer 152b are not different redistribution layers, electrically and physically independent from each other. For example, each of the first upper redistribution layer 152a and the second upper redistribution layer 152b may be partial regions of one upper redistribution layer 152 extending above the connection conductor 134 and the encapsulant 140.

According to an example embodiment of the present inventive concept, the semiconductor package 100A may further include a first solder resist layer SR1 and a second solder resist layer SR2. The first solder resist layer SR1 may be disposed below the lower redistribution structure 110, and the second solder resist layer SR2 disposed above the upper redistribution structure 150. The first and second solder resist layers SR1 and SR2 may protect the lower redistribution layer 112 and the upper redistribution layer 152 from physical and chemical damage. The first and second solder resist layers SR1 and SR2 may include an insulating material, and may be formed using, for example, prepreg, ABF, FR-4, BT, or a photo solder resist (PSR).

In addition, a UBM structure 160 and/or a connection bump 170 electrically connected to the lower redistribution layer 112 may be disposed below the lower redistribution structure 110. The UBM structure 160 may increase connection reliability of the connection bump 170, and as a result, board level reliability of the semiconductor package 100A may be increased. The connection bump 170 may be disposed below the UBM structure 160, and may have, for example, a spherical or ball shape made of a low-melting-point metal, for example, tin (Sn), indium (In), bismuth (Bi), antimony (Sb), copper (Cu), silver (Ag), zinc (Zn), lead (Pb), an alloy containing the same (e.g., Sn—Ag—Cu), or the like.

FIGS. 2A to 2F are cross-sectional views illustrating a manufacturing process of the semiconductor package 100A of FIG. 1A according to an example embodiment of the present inventive concept.

Figure 2A:
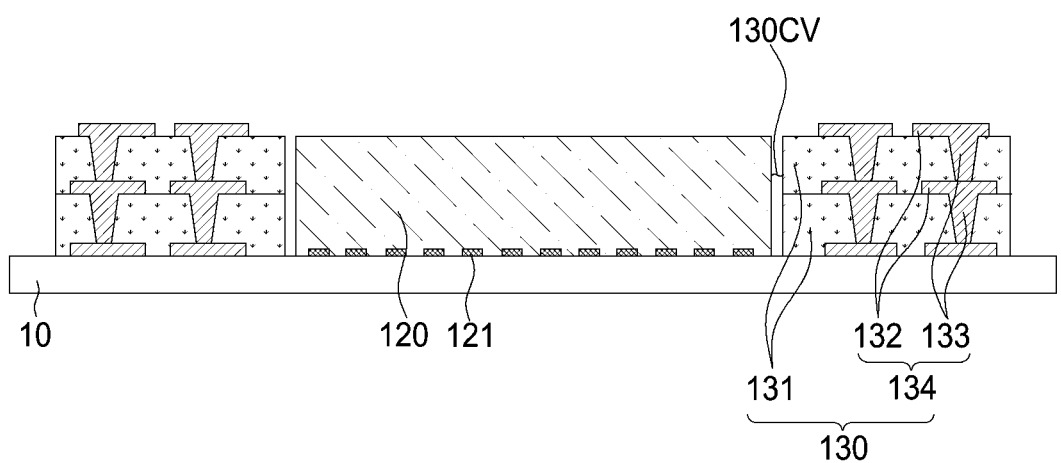
FIGS. 2A, 2B, 2C, 2D, 2E and 2F are cross-sectional views illustrating a manufacturing process of the semiconductor package of FIG. 1A according to an example embodiment of the present inventive concept.

Referring to FIG. 2A, a semiconductor chip 120 and a connection structure 130 (or a connection conductor 134) may be disposed on a first carrier 10. The first carrier 10 is a temporary carrier having adhesive properties, and may support the semiconductor chip 120 and the connection structure 130. For example, the semiconductor chip 120 may be disposed in a cavity 130CV at least partially surrounded by the connection structure 130. The connection structure 130 may include a connection conductor 134 providing an electrical path in a vertical direction (e.g., the Z-axis direction) along a side surface of the semiconductor chip 120.

Figure 2B:
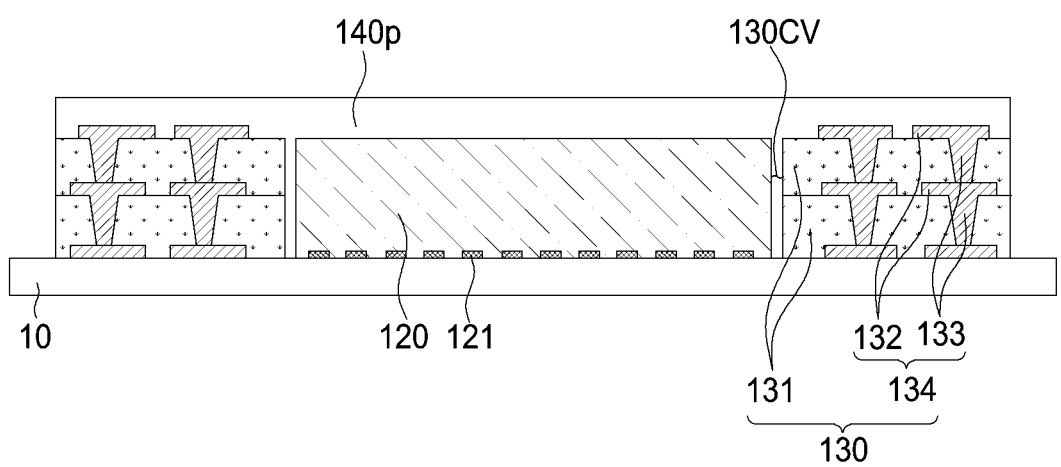

Referring to FIG. 2B, a preliminary encapsulant 140p for sealing the semiconductor chip 120 and the connection structure 130 may be formed on the first carrier 10. The preliminary encapsulant 140p may be formed by, for example, transferring a film-type insulating resin such as ABF onto the first carrier 10. The preliminary encapsulant 140p may be formed to cover an upper surface of the semiconductor chip 120 and an upper surface of the connection structure 130. Thereafter, the first carrier 10 may be removed, and the semiconductor chip 120 and the connection structure 130 sealed by the preliminary encapsulant 140p may be attached to a second carrier ('20' in FIG. 2C) so that the connection pad 121 of the semiconductor chip 120 is exposed.

Figure 2C:
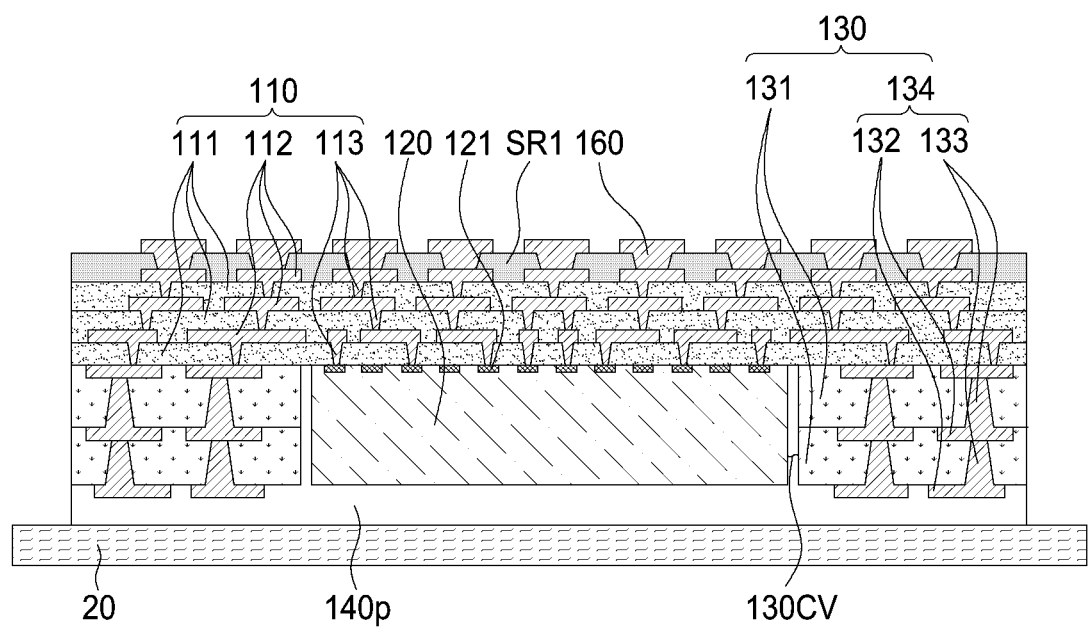

Referring to FIG. 2C, a lower redistribution structure 110 may be formed on the semiconductor chip 120 and the connection structure 130. The lower redistribution structure 110 may include a lower insulating layer 111, a lower redistribution layer 112, and a lower redistribution via 113. The lower insulating layer 111 may be formed by coating and curing a photosensitive material, for example, PID. Next, an exposure process and a development process by using a photomask may be performed to form via holes penetrating through the lower insulating layer 111. Next, a lower redistribution via 113 and a lower redistribution layer 112 may be formed using a deposition process, a plating process, an etching process, or the like. By repeating the above-described process, the lower redistribution structure 110 including the plurality of insulating layers 111 and the plurality of lower redistribution layers 112 may be formed. In an example embodiment of the present inventive concept, a first solder resist layer SR1 and a UMB structure 160 may be formed on the lower redistribution structure 110.

Figure 2D:
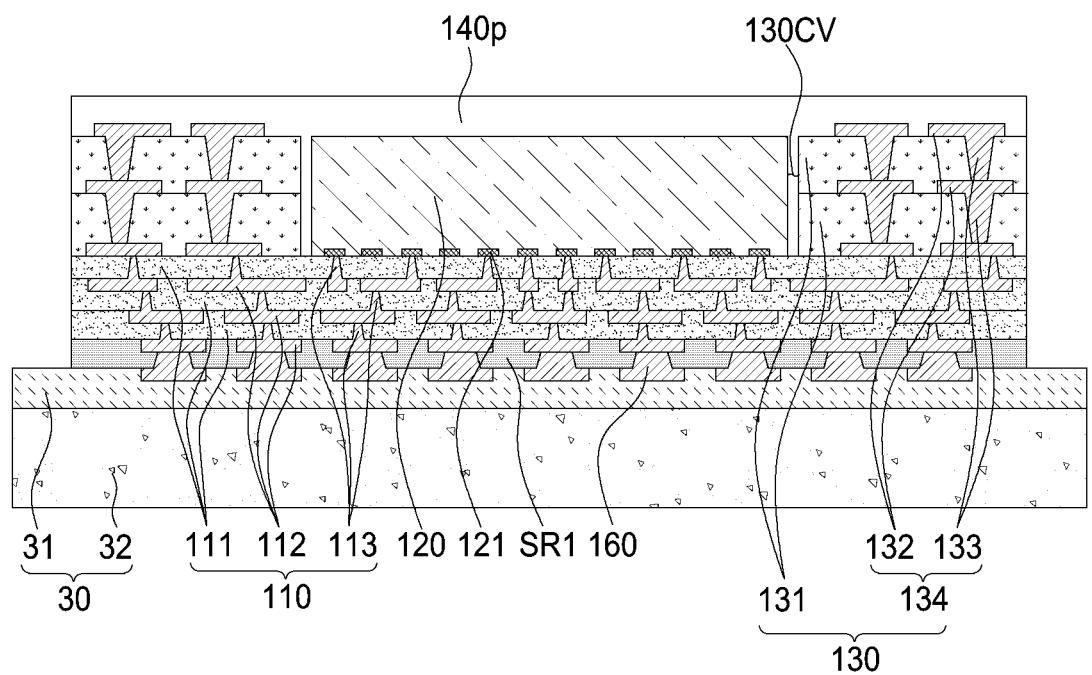

Referring to FIG. 2D, thereafter, the second carrier 20 may be removed, and a lower redistribution structure 110 may be attached to a third carrier 30 such that a preliminary encapsulant 140p faces an upward direction. The third carrier 30 may include an adhesive layer 31 and a core layer 32. The adhesive layer 31 may be attached to the lower redistribution structure 110, and the core layer 32 may support the adhesive layer 31. The adhesive layer 31 may be made of an adhesive polymer and a release layer. The release layer may be for peeling the core layer 32, and may be interposed between the adhesive layer 31 and the core layer 32.

Figure 2E:
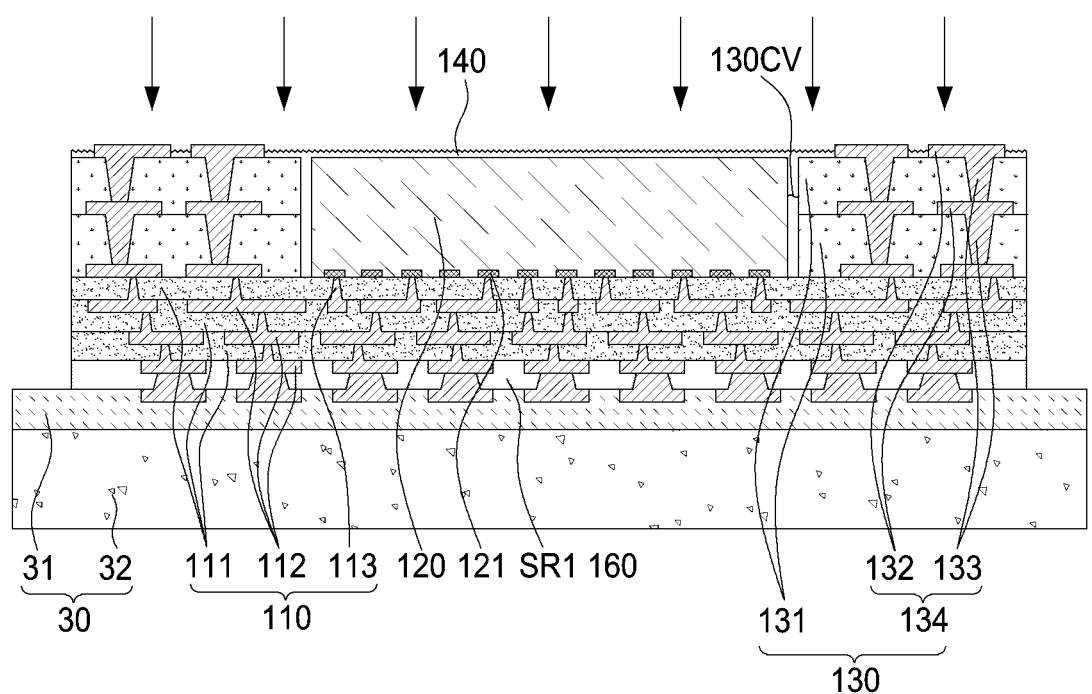

Referring to FIG. 2E, the preliminary encapsulant 140p of FIG. 2D may be processed to form an encapsulant 140. The encapsulant 140 may be formed by removing a portion of the preliminary encapsulant 140p through laser ablation. Accordingly, an upper surface of the encapsulant 140 may be disposed on a lower level than an upper surface of the connection conductor 134, and may include a plurality of grooves providing surface roughness (Ra) of a certain (or predetermined) level or higher. Since the encapsulant 140 is formed to cover an upper surface of the connection structure 130, damages to the connection structure 130 by laser processing may be prevented. In addition, since the upper surface of the encapsulant 140 has surface roughness (Ra) formed from laser processing, it is possible to secure adhesion with an upper insulating layer ('151' in FIG. 5F) that is to be formed later. Moreover, the encapsulant 140 may fill a space between the connection conductors 134, thereby minimizing a depth of a recess portion formed in the upper insulating layer ('151' in FIG. 5F). Laser processing can effectively remove the preliminary encapsulant 140p and prevent damage to the connection structure 130 by controlling conditions (e.g., power, etc.) of a laser beam. For example, laser processing may be performed using a continuous wave (CW) laser or a pulsed laser, for example, a femtosecond laser.

Figure 2F:
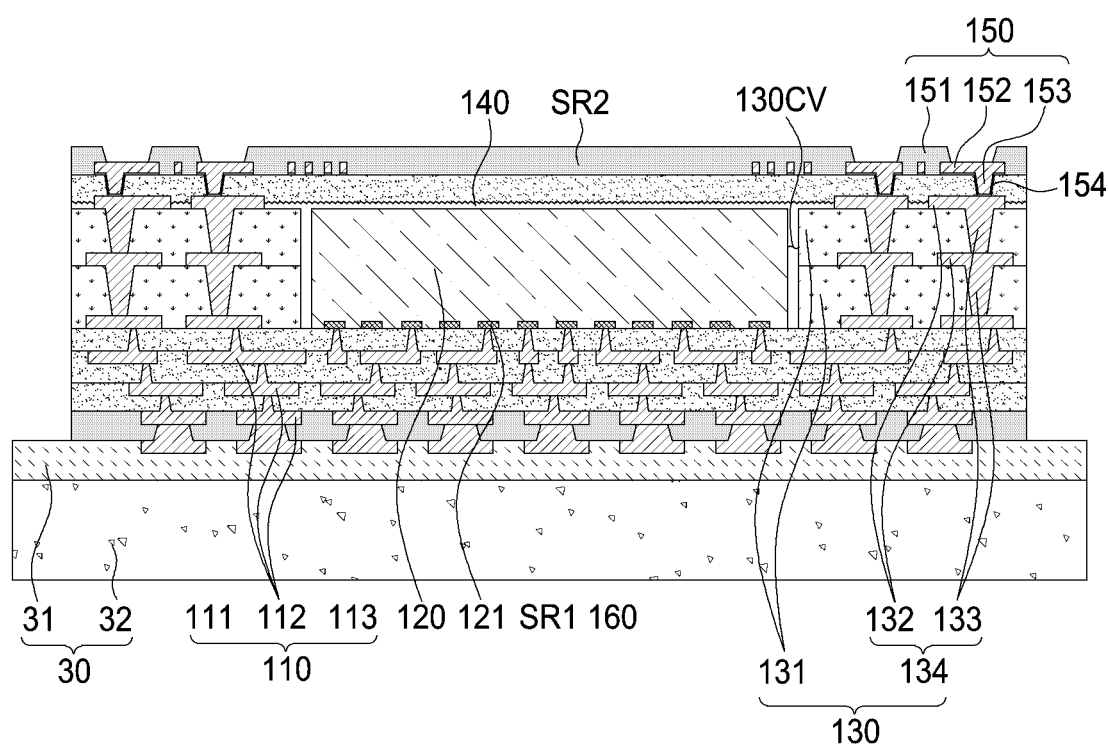

Referring to FIG. 2F, an upper redistribution structure 150 may be formed on the encapsulant 140 and the connection conductors 134. The upper redistribution structure 150 may include an upper insulating layer 151, upper redistribution layers 152, and upper redistribution vias 153. The upper insulating layer 151, the upper redistribution layer 152, and the upper redistribution via 153 may be formed in a similar manner to that of the lower insulating layer 111, the lower redistribution layer 112, and the lower redistribution via 113 described with reference to FIG. 2C. According to the present inventive concept, since the undulation of the upper insulating layer 151 and the step thickness difference between the upper redistribution layers 152 are minimized, it is possible to form the upper redistribution layers 152 and the upper redistribution vias 153 with a fine pitch. In an example embodiment of the present inventive, a second solder resist layer SR2 covering at least a portion of the upper redistribution layers 152 may be formed on the upper redistribution structure 150.

Figure 3A:
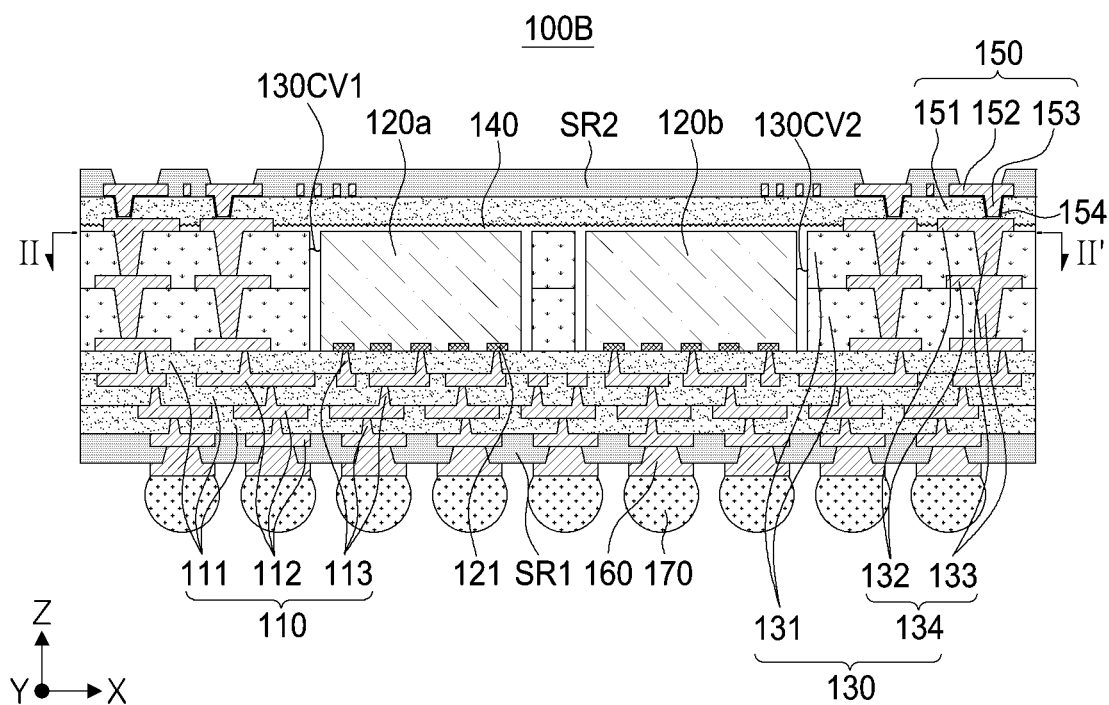
FIG. 3A is a cross-sectional view illustrating a semiconductor package according to an example embodiment of the present inventive concept.
Figure 3B:
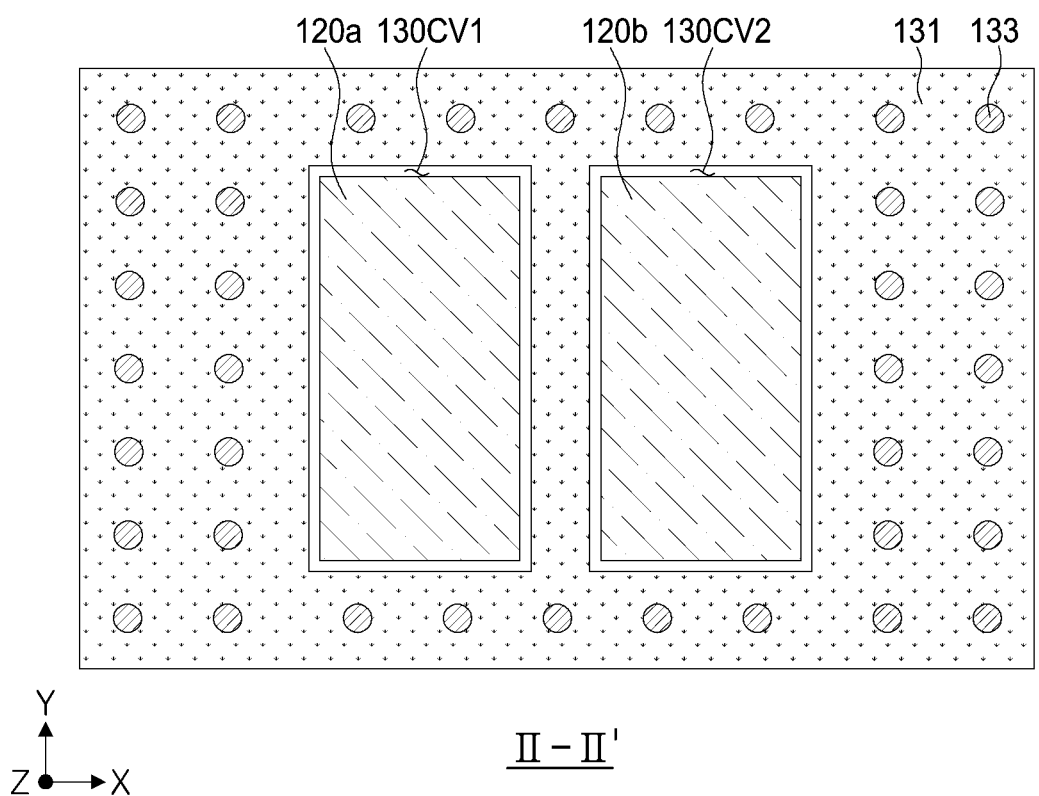
FIG. 3B is a plan view illustrating a cross-section taken along line II-II' of FIG. 3A.

FIG. 3A is a cross-sectional view illustrating a semiconductor package 100B according to an example embodiment of the present inventive concept, and FIG. 3B is a plan view illustrating a cross-section taken along line II-II' of FIG. 3A.

Referring to FIGS. 3A and 3B a semiconductor package 100B according to an example embodiment of the present inventive concept may have same or similar characteristics (e.g., configurations, arrangements, and components) as the semiconductor package 100A illustrated in FIGS. 1A to 1C, except that the semiconductor package 100B includes a plurality of semiconductor chips 120a and 120b. For example, it may be understood that the semiconductor package 100B according to an example embodiment of the present inventive concept has a structure similar to that illustrated in FIG. 1C. The plurality of semiconductor chips 120a and 120b may be disposed on the lower redistribution structure 110 and may be spaced apart from each other in a horizontal direction. In addition, the plurality of semiconductor chips 120a and 120b may include different types of semiconductor chips. For example, a 1-1 semiconductor chip 120a may include an AP chip, and a 1-2 semiconductor chip 120b may include a power management integrated circuit (PMIC) chip.

The connection structure 130 may include a plurality of cavities 130CV1 and 130CV2 accommodating the plurality of semiconductor chips 120a and 120b, respectively. For example, the connection structure 130 may include a first cavity 130CV1, in which the 1-1 semiconductor chip 120a is disposed, and a second cavity 130CV2, in which the 1-2 semiconductor chip 120b is disposed. According to an example embodiment of the present inventive concept, the first cavity 130CV1 and the second cavity 130CV2 may be formed as a single cavity connected to each other.

Figure 4:
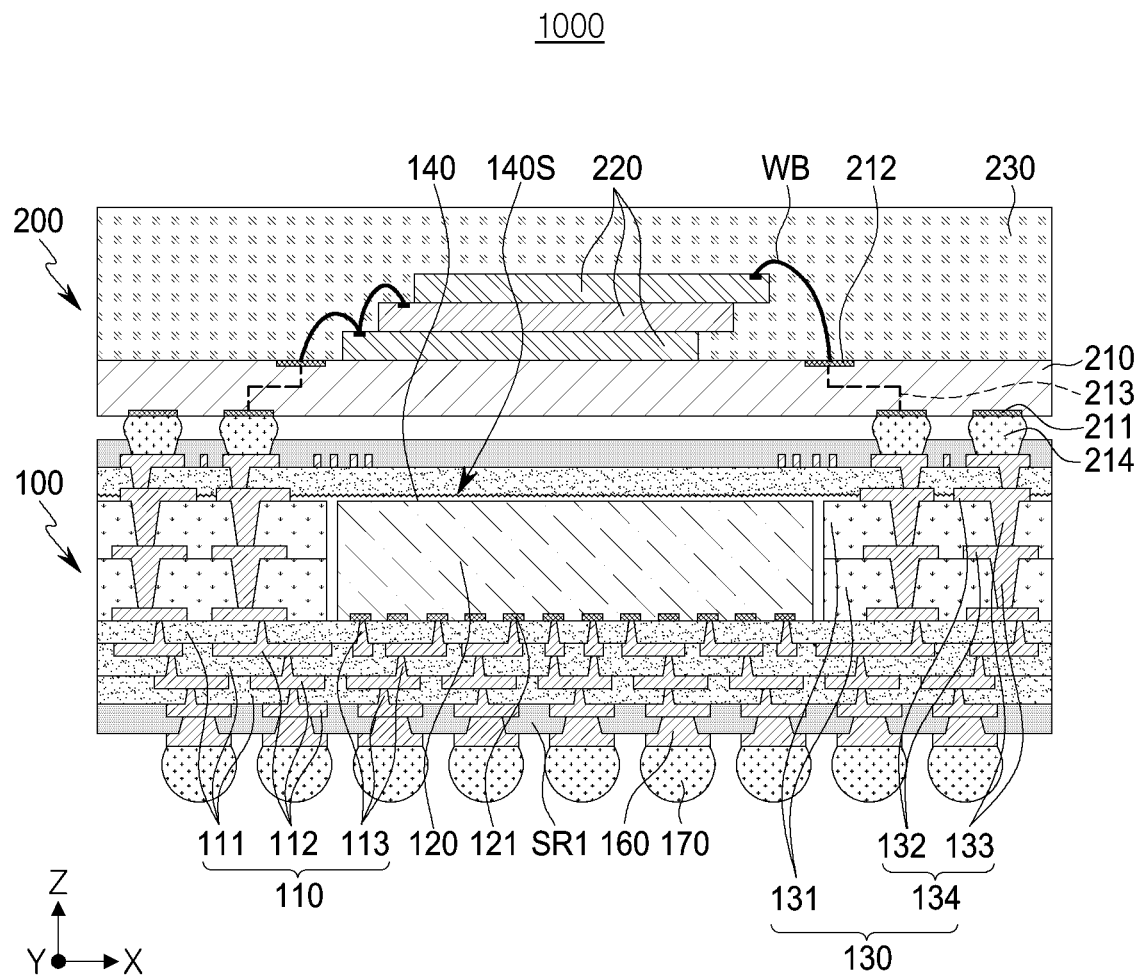
FIG. 4 is a cross-sectional view illustrating a semiconductor package according to an example embodiment of the present inventive concept.

FIG. 4 is a cross-sectional view illustrating a semiconductor package 1000 according to an example embodiment of the present inventive concept.

Referring to FIG. 4, the semiconductor package 1000 according to an example embodiment of the present inventive concept may have a package-on-package structure including a first package 100 and a second package 200. The first package 100 may have the same or similar characteristics to the semiconductor packages 100A and 100B described with reference to FIGS. 1A to 3.

The second package 200 may include a second redistribution substrate 210, a second semiconductor chip 220, and a second encapsulant 230. The second redistribution substrate 210 may include a lower pad 211 and an upper pad 212 electrically connected to the outside, and the lower pad 211 and the upper pad 212 are respectively disposed on a lower surface and an upper surface of the second redistribution substrate 210. The upper pad 212 and the lower pad 211 may be electrically connected to each other. In addition, in the second redistribution substrate 210, a redistribution circuit 213 may connect the lower pad 211 and the upper pad 212 to each other.

The second semiconductor chip 220 may be mounted on the second redistribution substrate 210 by wire bonding or flip-chip bonding. For example, the plurality of second semiconductor chips 220 may be vertically stacked on the redistribution substrate 210, and electrically connected to the upper pad 212 of the redistribution substrate 210 by a bonding wire WB. In one example, the second semiconductor chip 220 may include a memory chip, and the first semiconductor chip 120 may include an AP chip.

The second encapsulant 230 may include the same or similar material to the encapsulant 140 of the first package 100. The second package 200 may be physically and electrically connected to the first package 100 by a metal bump 214. The metal bump 214 may be electrically connected to the redistribution circuit 213 inside the redistribution substrate 210 through the lower pad 211 on the lower surface of the redistribution substrate 210. The metal bump 214 may be formed of a low-melting-point metal, for example, tin (Sn) or an alloy including tin (Sn).

As set forth above, according to example embodiment of the present inventive concept, a semiconductor package including an upper redistribution structure having a fine pitch may be provided.

It is to be understood that spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, in the example, terms "below" and "beneath" may encompass both an orientation of above, below and beneath. The device may be otherwise oriented (e.g., rotated 90 degrees or at other orientations) and the spatially relative descriptors used herein may be interpreted accordingly.

The meaning of a "connection" of a component to another component in the description includes an indirect connection through an adhesive layer as well as a direct connection between two components. It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the spirit and scope of the present invention.

It is to be understood that example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

It is to be understood that singular forms include plural forms unless the context clearly indicates the contrary.

While the present inventive concept has been particularly shown and described with reference to example embodiments thereof, it will be apparent to those of ordinary skill in the art that various changes in form and detail may be made thereto without departing from the spirit and scope of the present inventive concept

What is claimed is:

1. A semiconductor package, comprising:
    a lower redistribution structure including a lower insulating layer and a lower redistribution layer disposed on the lower insulating layer;
    a semiconductor chip disposed on the lower redistribution structure, and including a connection pad electrically connected to the lower redistribution layer;
    connection conductors disposed around the semiconductor chip on the lower redistribution structure, and electrically connected to the lower redistribution layer;
    an encapsulant disposed on at least a portion of the semiconductor chip and the connection conductors; and
    an upper redistribution structure including an upper insulating layer and upper redistribution layers, wherein the upper insulating layer is disposed on the encapsulant, wherein the upper redistribution layers are disposed on the upper insulating layer and are electrically connected to the connection conductors,
    wherein an upper surface of each of the connection conductors and an upper surface of the encapsulant form a first step in a first direction, perpendicular to an upper surface of the lower redistribution structure,
wherein the upper redistribution layers include a first upper redistribution layer and a second upper redistribution layer, wherein the first upper redistribution layer does not overlap the connection conductors, wherein the second upper redistribution layer overlaps the connection conductors, in the first direction, wherein a lower surface of the first upper redistribution layer and a lower surface of the second upper redistribution layer form a second step, and wherein a height of the second step is equal to or smaller than a height of the first step in the first direction.

2. The semiconductor package of claim 1, wherein the upper insulating layer has a recess portion, wherein the first upper redistribution layer is disposed in the recess portion.

3. The semiconductor package of claim 2, wherein the recess portion is disposed between the connection conductors.

4. The semiconductor package of claim 2, wherein a maximum depth of the recess portion is equal to the height of the second step.

5. The semiconductor package of claim 1, wherein the height of the second step is 1 µm or less.

6. The semiconductor package of claim 1, wherein the height of the first step is 5 µm or less.

7. The semiconductor package of claim 1, wherein the upper insulating layer comprises a photosensitive resin.

8. The semiconductor package of claim 1, wherein the encapsulant comprises a non-photosensitive resin.

9. The semiconductor package of claim 1, wherein the upper redistribution layers comprise a seed layer disposed on the upper insulating layer.

10. The semiconductor package of claim 9, wherein the seed layer comprises titanium (Ti) or a titanium (Ti) alloy.

11. The semiconductor package of claim 1, further comprising:
a connection structure including an insulating layer and the connection conductors extending in the first direction in the insulating layer, wherein the connection structure has a cavity in which the semiconductor chip is disposed.

12. The semiconductor package of claim 11, wherein each of the connection conductors comprises a wiring layer and a wiring via, wherein the wiring layer is disposed on the insulating layer, and the wiring via penetrates through the insulating layer to electrically connect the wiring layer and the lower redistribution layer to each other.

13. The semiconductor package of claim 11, wherein the encapsulant covers at least a portion of an upper surface of the insulating layer and at least a portion of a side surface of each of the connection conductors protruding beyond the upper surface of the insulating layer.

14. The semiconductor package of claim 13, wherein a thickness of the encapsulant covering the upper surface of the insulating layer is about-1 µm or more.

15. A semiconductor package, comprising:
a lower redistribution structure including a lower redistribution layer;
a semiconductor chip disposed on the lower redistribution structure, and including a connection pad electrically connected to the lower redistribution layer;
connection conductors disposed adjacent to the semiconductor chip on the lower redistribution structure, and electrically connected to the lower redistribution layer;
an encapsulant covering at least a portion of the semiconductor chip and the connection conductors; and
an upper redistribution structure including an upper insulating layer and upper redistribution layers, wherein the upper insulating layer is disposed on an upper surface of the encapsulant and upper surfaces of the connection conductors, wherein the upper redistribution layers are disposed on the upper insulating layer and electrically connected to the connection conductors,
wherein the upper surface of the encapsulant is disposed on a level lower than that of the upper surfaces of the connection conductors, and
wherein a first portion of the upper redistribution layers disposed on the upper surface of the encapsulant are disposed on a level lower than that of a second portion of the upper redistribution layers disposed on an upper surface of a corresponding connection conductor of the connection conductors.

16. The semiconductor package of claim 15, wherein a distance from a lower surface of the first portion of the upper redistribution layers to a lower surface of the second portion of the upper redistribution layers is 1 µm or less in a vertical direction.

17. A semiconductor package, comprising:
a lower redistribution structure including a lower redistribution layer;
a semiconductor chip disposed on the lower redistribution structure, and including a connection pad electrically connected to the lower redistribution layer;
connection conductors disposed around the semiconductor chip on the lower redistribution structure, and electrically connected to the lower redistribution layer;
an encapsulant disposed on at least portions of side surfaces of the connection conductors, and having an upper surface including a plurality of grooves; and
an upper redistribution structure including an upper insulating layer and an upper redistribution layer, wherein the upper insulating layer is disposed on the encapsulant and the connection conductors, and the upper redistribution layer is disposed on the upper insulating layer and electrically connected to the connection conductors, and
wherein there is a height difference between the upper surface of the encapsulant and an upper surface of a first connection conductor of the connection conductors.

18. The semiconductor package of claim 17, wherein the upper surface of the encapsulant has a surface roughness of 1 µm or more.

19. The semiconductor package of claim 17, wherein the encapsulant comprises a non-photosensitive resin impregnated with an inorganic filler.

20. The semiconductor package of claim 17, wherein the upper insulating layer comprises a photosensitive resin.

* * * * *